(12) United States Patent
Taniguchi

(10) Patent No.: US 7,626,475 B2
(45) Date of Patent: Dec. 1, 2009

(54) SAW FILTER DEVICE

(75) Inventor: Yasumawa Taniguchi, Kaga (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/132,033

(22) Filed: Jun. 3, 2008

(65) Prior Publication Data

US 2008/0224799 A1    Sep. 18, 2008

Related U.S. Application Data

(63) Continuation of application No. PCT/JP2007/050020, filed on Jan. 5, 2007.

(30) Foreign Application Priority Data

Feb. 13, 2006  (JP) ............................. 2006-035385

(51) Int. Cl.
H03H 9/64    (2006.01)
(52) U.S. Cl. ...................................... 333/195
(58) Field of Classification Search .............. 333/193, 333/195
See application file for complete search history.

(56) References Cited

U.S. PATENT DOCUMENTS

| 5,729,186 | A | 3/1998 | Seki et al. |
| 6,262,637 | B1 * | 7/2001 | Bradley et al. ............... 333/133 |
| 6,404,302 | B1 | 6/2002 | Satoh et al. |
| 7,209,018 | B2 * | 4/2007 | Nakao et al. ................. 333/195 |
| 2001/0013739 | A1 * | 8/2001 | Yoshida et al. ............ 310/313 A |
| 2003/0020562 | A1 | 1/2003 | Ikada et al. |
| 2004/0051601 | A1 * | 3/2004 | Frank ........................... 333/187 |
| 2004/0061572 | A1 | 4/2004 | Nakamura |
| 2005/0099244 | A1 | 5/2005 | Nakamura et al. |
| 2007/0030094 | A1 * | 2/2007 | Omote ......................... 333/133 |

FOREIGN PATENT DOCUMENTS

| JP | 63-082113 A | 4/1988 |
| JP | 06-350391 A | 12/1994 |
| JP | 08-321743 A | 12/1996 |
| JP | 10-065490 A | 3/1998 |

OTHER PUBLICATIONS

Official communication issued in the International Application No. PCT/JP2007/050020, mailed on Apr. 17, 2007.

* cited by examiner

*Primary Examiner*—Benny Lee
*Assistant Examiner*—Alan Wong
(74) *Attorney, Agent, or Firm*—Keating & Bennett, LLP

(57) ABSTRACT

A SAW filter device includes a SAW filter chip in which one-port surface acoustic wave resonators each including an IDT made of Al or an Al alloy, are provided on a θ-rotated Y-cut X-propagation $LiNbO_3$ substrate. The cutting angle θ of the θ-rotated Y-cut X-propagation $LiNbO_3$ substrate is in the range between about 50° and about 55°. The normalized film thickness of the IDT 100h/λ (%) (h denotes the thickness of the IDT and λ denotes the wavelength of a surface acoustic wave) is in the range between about 2% and about 4%. The duty ratio of the IDT is equal to or less than about 0.4.

8 Claims, 9 Drawing Sheets

SAW FILTER DEVICE

BACKGROUND OF THE INVENTION

1. Field of the Invention

The present invention relates to SAW filter devices used as band-pass filters for mobile telephones, and, more particularly, to a SAW filter device in which a plurality of one-port SAW resonators are connected.

2. Description of the Related Art

Currently, various surface acoustic wave filters are used as band-pass filters included in RF stages in communication apparatuses, such as mobile telephones. A known surface acoustic wave filter is disclosed in Japanese Unexamined Patent Application Publication No. 9-121136.

In a surface acoustic wave filter disclosed in Japanese Unexamined Patent Application Publication No. 9-121136, a series arm surface acoustic wave resonator, an output electrode, a parallel arm surface acoustic wave resonator, and a ground electrode are disposed on a 41°-rotated Y-cut X-propagation LiNbO$_3$ substrate. The series arm surface acoustic wave resonator includes IDTs, one of which is connected to the output electrode. The parallel arm surface acoustic wave resonator includes IDTs, one of which is connected to the output electrode and the other one of which is connected to the ground electrode. These IDTs are formed from metal films made of Al or an Al alloy, and the thickness of the metal films ranges from about 2.5% to about 7.5% of the electrode cycle of the IDTs included in the parallel arm surface acoustic wave resonator. Consequently, a frequency characteristic having a wide and flat pass band with no spurious components is obtained.

"Hyomenha Debaisu To Sono Oyo" (Surface Acoustic Wave Device and Application Thereof), edited by Electronic Materials Manufacturers Association of Japan, published by The Nikkan Kogyo Shimbun, Ltd., Dec. 25, 1978, First Edition, pp. 17 and FIG. 1.7 discloses changes in phase velocity and electromechanical coupling coefficient of a Rayleigh wave and a leaky surface acoustic wave which propagate on a LiNbO$_3$ substrate. The changes are caused by the cutting angle of the LiNbO$_3$ substrate. That is, "Hyomenha Debaisu To Sono Oyo" (Surface Acoustic Wave Device and Application Thereof), edited by Electronic Materials Manufacturers Association of Japan, published by The Nikkan Kogyo Shimbun, Ltd., Dec. 25, 1978, First Edition, pp. 17 and FIG. 1.7 describes the fact that, with a 41°-rotated Y-cut X-propagation LiNbO$_3$ substrate whose cutting angle is 41°, the electromechanical coupling coefficient of a leaky surface acoustic wave has a large value, but a Rayleigh wave exhibits piezoelectricity, and, with a cutting angle of 60° to 70°, the electromechanical coupling coefficient of a leaky surface acoustic wave has a value smaller than that obtained in the case of the cutting angle of 41°, but a Rayleigh wave does not exhibit piezoelectricity.

FIG. 1.7 in "Hyomenha Debaisu To Sono Oyo" (Surface Acoustic Wave Device and Application Thereof), edited by Electronic Materials Manufacturers Association of Japan, published by The Nikkan Kogyo Shimbun, Ltd., Dec. 25, 1978, First Edition, pp. 17, describes the fact that the propagation velocity ratio of a Rayleigh wave to a leaky surface acoustic wave is about 0.8 when a cutting angle ranges from about 41° to about 60°.

In Japanese Unexamined Patent Application Publication No. 9-121136, the IDTs having the above-described predetermined film thickness are disposed on the 41°-rotated Y-cut X-propagation LiNbO$_3$ substrate, whereby a wide pass band and the reduced spurious component are achieved. However, if a filter device having a trap band and a pass band lower than the trap band is created using this LiNbO$_3$ substrate, a wide trap band can be obtained, but an insertion loss is increased in the pass band lower than the trap band and in a high frequency end portion of the pass band.

That is, as described in "Hyomenha Debaisu To Sono Oyo" (Surface Acoustic Wave Device and Application Thereof), edited by Electronic Materials Manufacturers Association of Japan, published by The Nikkan Kogyo Shimbun, Ltd., Dec. 25, 1978, First Edition, pp. 17 and FIG. 1.7, with the 41° to 60°-rotated Y-cut X-propagation LiNbO$_3$ substrate, the propagation velocity ratio of a Rayleigh wave to a leaky surface acoustic wave is about 0.8. Accordingly, if a filter device having a pass band lower than a trap band is created using this LiNbO$_3$ substrate, a spurious component is generated under the influence of a Rayleigh wave at a frequency that is about 0.8 times a trap frequency. This causes a deterioration of an insertion loss in the pass band.

DETAILED DESCRIPTION OF PREFERRED EMBODIMENTS

To overcome the problems described above, preferred embodiments of the present invention provide a SAW filter device that has a pass band lower than a trap band and is capable of reducing an insertion loss in the pass band and in a high frequency end portion of the pass band and achieving a wide trap band.

According to a preferred embodiment of the present invention, a SAW filter device has a trap band and a pass band lower than the trap band. The SAW filter device includes a filter chip including a θ-rotated Y-cut X-propagation LiNbO$_3$ substrate and a plurality of one-port SAW resonators provided on the θ-rotated Y-cut X-propagation LiNbO$_3$ substrate. Each of the plurality of one-port SAW resonators includes an IDT made of Al or an Al alloy. A cutting angle θ of the θ-rotated Y-cut X-propagation LiNbO$_3$ is in a range between about 50° and about 55°. A normalized film thickness of the IDT 100h/λ (%) (h denotes a thickness of the IDT and λ denotes a wavelength of a surface acoustic wave) is in a range between about 2% and about 4%. A duty ratio of the IDT is equal to or less than about 0.4.

Preferably, the SAW filter device further includes a plurality of first inductors inserted in a series arm connecting an input terminal and an output terminal. One of the plurality of one-port SAW resonators is connected between the input terminal and a ground potential, another one of the plurality of one-port SAW resonators is connected between the output terminal and the ground potential, and the others of the plurality of one-port SAW resonators are each connected between the ground potential and a node between two of the plurality of first inductors. In this case, a signal can be transmitted in the pass band and a frequency band lower than the pass band. In the trap band, a signal is significantly attenuated. Furthermore, the generation of a spurious component in the pass band is effectively reduced.

Preferably, the SAW filter device further includes a mount substrate on which a filter chip is disposed. The mount substrate has a single ground terminal, and all portions to be connected to the ground potential which are included in the filter chip are electrically connected to the ground terminal. The one of the plurality of one-port SAW resonators connected between either the input terminal or the output terminal and the ground potential defines a capacitive element in the trap band and the pass band, and has a resonant frequency higher than an antiresonant frequency of the others of the plurality of one-port SAW resonators. In this case, the size of the SAW filter device can be reduced. Furthermore, a wave that is directly transmitted between the input terminal and the output terminal is reduced, and the deterioration of the amount of attenuation in the trap band is prevented.

Preferably, the SAW filter device further includes a trap circuit portion including a first inductor inserted in a series arm connecting an input terminal and an output terminal, and first resonators, one of which is connected between one end of the first inductor and a ground potential and the other one of which is connected between the other end of the first inductor and the ground potential, and a filter circuit portion provided between the trap circuit portion and at least one of the input terminal and the output terminal. The filter circuit portion includes a second resonator connected between the trap circuit portion and either the input terminal or the output terminal included in the series arm, and a second inductor connected between one end of the second resonator and the ground potential. A resonant frequency of the second resonator is substantially the same as a high frequency end of the pass band. The first resonators and the second resonator are included in the plurality of one-port SAW resonators. In this case, a signal can be transmitted in the pass band, and a signal can be attenuated in a frequency band lower than the pass band and the trap band. Consequently, the generation of a spurious component in the pass band is effectively reduced.

Preferably, the SAW filter device further includes a filter circuit portion including a third inductor inserted in a series arm connecting an input terminal and an output terminal and a first resonator connected in series to the third inductor, and a trap circuit portion including at least one first inductor inserted in the series arm, a second resonator connected between one end of the first inductor and a ground potential, and a third resonator connected between the other end of the first inductor and the ground potential. The filter circuit portion and the trap circuit portion are connected in series in the series arm. The pass band has a first center frequency. A second center frequency is higher than the first center frequency. The second center frequency is included in a filter frequency characteristic composed of capacitance components of the first, second, and third resonators and inductance components of the first and third inductors. The first, second, and third resonators are included in the plurality of one-port SAW resonators. In this case, a signal can be transmitted in the pass band, and a signal can be attenuated in a frequency band such as a VHF band lower than the pass band, the trap band, and a frequency band higher than the trap band. Consequently, the generation of a spurious component in the pass band is effectively prevented.

Preferably, the inductors are chip inductance components. In this case, the inductors can be surface mounted and the size of the SAW filter device can therefore be reduced. However, the above-described inductors may not be chip inductance components, and instead, may be another type of inductance components.

Preferably, the SAW filter device further includes a circuit substrate underlying the mount substrate on which the filter chip including the $LiNbO_3$ substrate is provided. The inductors are embedded in the mount substrate.

Alternatively, the SAW filter device may include a circuit substrate underlying the mount substrate on which the filter chip including the $LiNbO_3$ substrate is provided. The inductors are embedded in the circuit substrate.

As described above, if the inductors are embedded in the circuit substrate or the mount substrate, external electronic components are not required for the inductors. Accordingly, the SAW filter device can be further miniaturized. Furthermore, the number of parts can be reduced. Still furthermore, the variations in characteristic are minimized when an inductance component is used.

In a SAW filter device according to preferred embodiments of the present invention, a plurality of one-port SAW resonators each including an IDT made of Al or an Al alloy are provided on a θ-rotated Y-cut X-propagation $LiNbO_3$ substrate so that the SAW filter device can have a trap band and a pass band lower than the trap band. The cutting angle θ of the $LiNbO_3$ substrate is preferably set so that it is within the range between about 50° and about 55°. The film thickness of the IDT, that is, the normalized film thickness of the IDT is preferably set so that it is within the range between about 2% and about 4%. The duty ratio of the IDT is preferably set to a value equal to or less than about 0.4. Accordingly, as will be apparent from descriptions of the following preferred embodiments, an insertion loss can be effectively reduced in the pass band and in the high frequency end portion. Furthermore, a wide stop bandwidth in the trap band can be obtained. Consequently, preferred embodiments of the present invention provide a SAW filter device having a wide trap band and a low-loss pass band lower than the trap band.

Other features, elements, processes, steps, characteristics and advantages of the present invention will become more apparent from the following detailed description of preferred embodiments of the present invention with reference to the attached drawings.

DETAILED DESCRIPTION OF THE PREFERRED EMBODIMENTS

Preferred embodiments of the present invention will be described in detail below with reference to the accompanying drawings.

Figure 1:
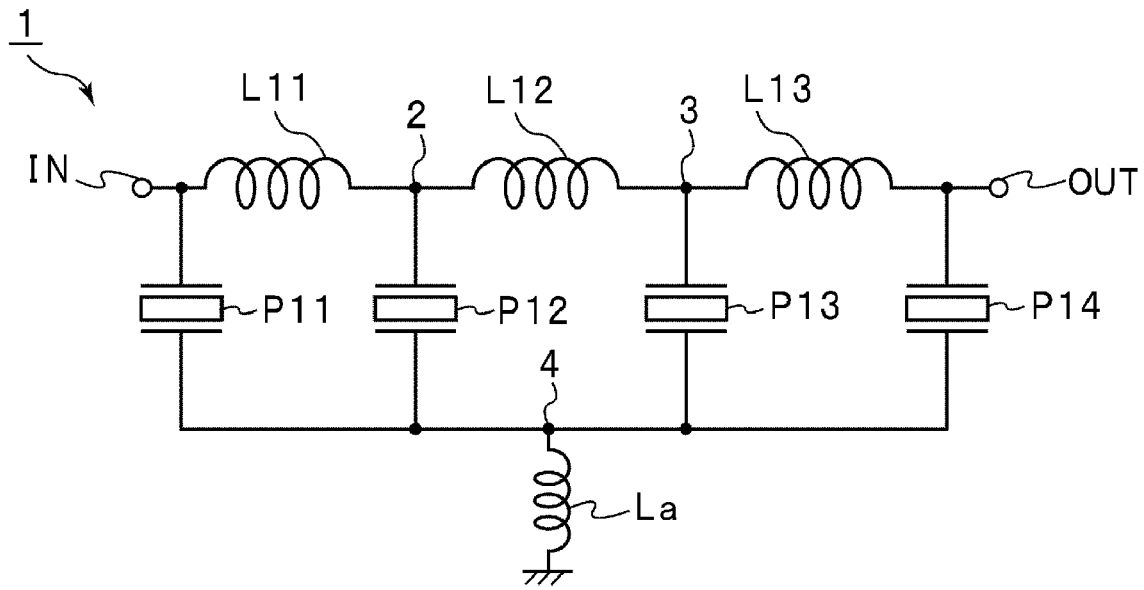
FIG. 1 is a circuit diagram of a SAW filter device according to a first preferred embodiment of the present invention.

FIG. 1 is a circuit diagram of a SAW filter device according to a first preferred embodiment of the present invention.

A SAW filter device 1 according to this preferred embodiment includes a series arm connecting an input terminal IN and an output terminal OUT. In the series arm, inductors L11, L12, and L13 are connected in series with each other.

A surface acoustic wave resonator P11 is provided in a parallel arm connecting a ground potential and a node between the inductor L11 and the input terminal IN. A surface acoustic wave resonator P12 is provided in a parallel arm connecting the ground potential and a node 2 between the inductor L11 and the inductor L12. A surface acoustic wave resonator P13 is provided in a parallel arm connecting the ground potential and a node 3 between the inductor L12 and the inductor L13. A surface acoustic wave resonator P14 is provided in a parallel arm connecting the ground potential and a node between the inductor L13 and the output terminal OUT.

All of the surface acoustic wave resonators P11 to P14 are one-port SAW resonators. One end of each of the surface acoustic wave resonators P11 to P14 is connected to the ground potential via a common terminal 4. An inductor La is connected between the common terminal 4 and the ground potential.

The SAW filter device 1 is a band elimination filter having a trap band and a pass band that is lower than the trap band. In the SAW filter device 1, a resonant frequency of the surface acoustic wave resonator P11, which is a first surface acoustic wave resonator, is substantially the same as that of the surface acoustic wave resonators P12 and P13, which are two second surface acoustic wave resonators. The surface acoustic wave resonator P14, which is a third surface acoustic wave resonator, functions as a capacitative element. A resonant frequency of the third surface acoustic wave resonator P14 is higher than an antiresonant frequency of the second surface acoustic wave resonators P12 and P13. The third surface acoustic wave resonator P14 functions as a capacitative element in the trap band and the pass band.

In this preferred embodiment, the inductor La is electrically connected between the common terminal 4 and the ground potential. In the trap band, since the impedance of the surface acoustic wave resonator P11 is low, a voltage is applied to the inductor La and a signal is generated. However, in this preferred embodiment, the impedance of the third surface acoustic wave resonator P14 in the trap band is set to a value about fifty times that obtained at a resonant frequency. That is, since the third surface acoustic wave resonator P14 functions as a capacitative element in the pass band, it is difficult for the above-described signal generated in the inductor La to pass in a direction toward the output terminal OUT.

Thus, the deterioration of an attenuation caused by a directly transmitted wave is prevented.

The surface acoustic wave resonator P14 not only functions as a capacitative element in the trap band but also defines a parallel resonant circuit with the inductor L13. Accordingly, if the parallel resonant frequency of this parallel resonant circuit is in the trap band of the SAW filter device 1, an impedance in the trap band is increased. This leads to the increase in the impedance between the inductor La and the output terminal OUT. Consequently, the effect of the above-described directly transmitted wave is more effectively prevented.

The detailed configuration of the SAW filter device 1 will be described with reference to FIGS. 2 to 5.

Figure 2:
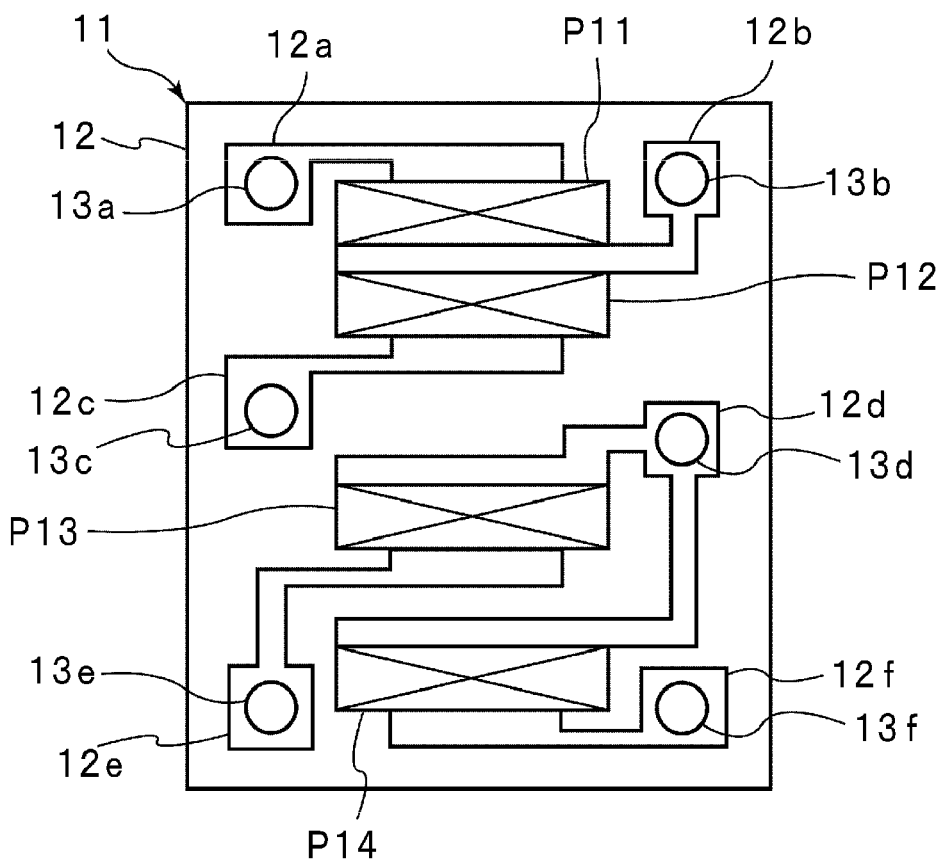
FIG. 2 is a schematic plan view in which an electrode configuration provided on the undersurface of a SAW filter chip according to the first preferred embodiment is seen through a substrate.
Figure 3:
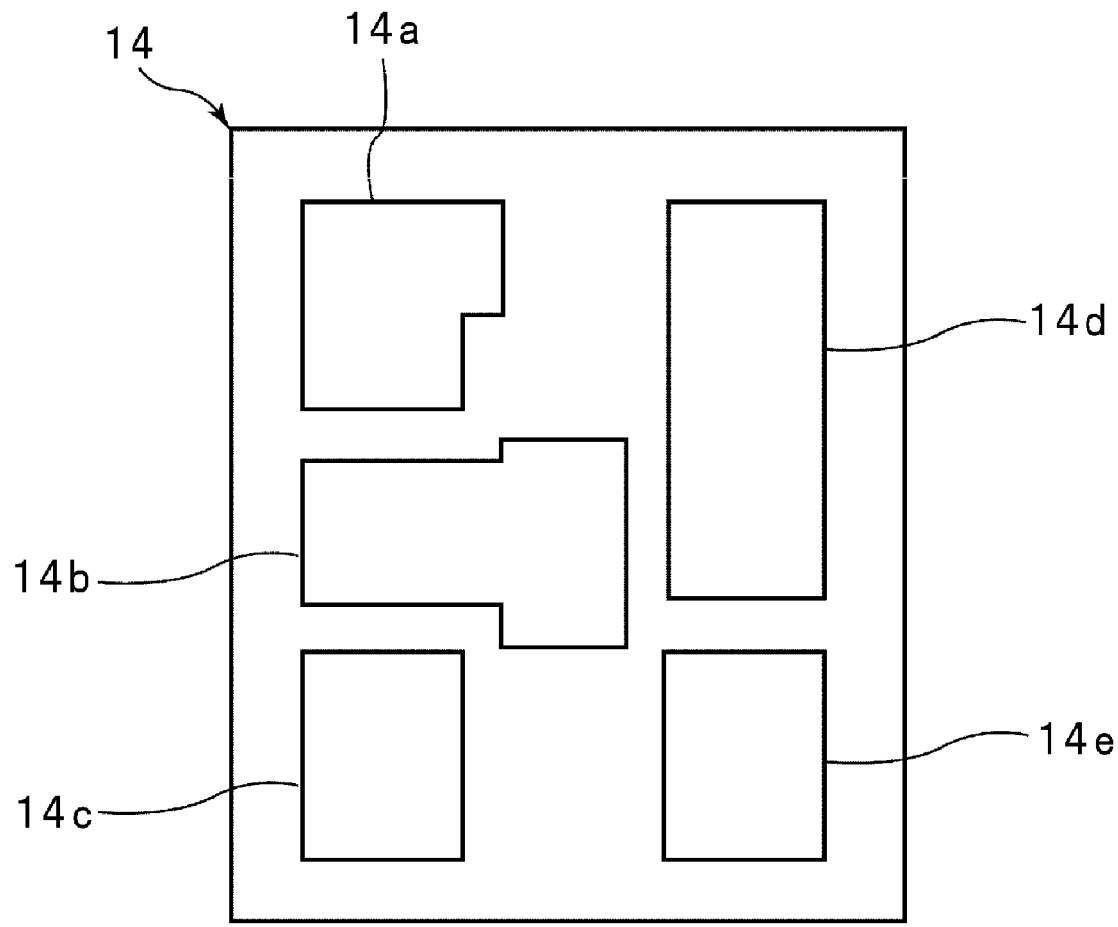
FIG. 3 is a plan view of a mount substrate according to the first preferred embodiment of the present invention that is a package material.
Figure 4:
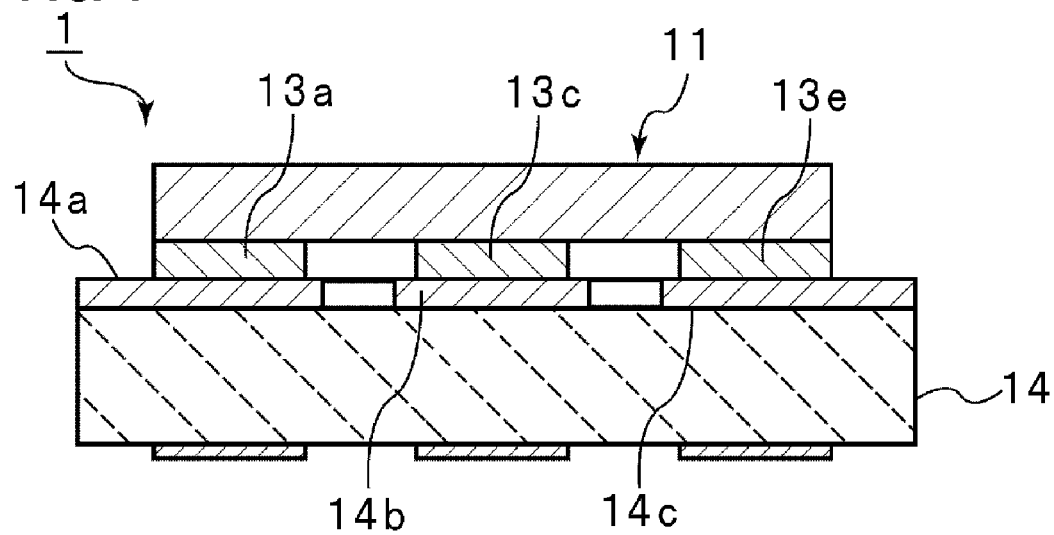
FIG. 4 is a schematic elevational cross-sectional view illustrating a configuration of a SAW filter device according to the first preferred embodiment of the present invention.

In the SAW filter device 1 according to this preferred embodiment, a filter chip 11 illustrated in FIG. 2 is provided on a mount substrate 14 illustrated in plan view in FIG. 3 using the flip chip bonding method. FIG. 4 is a schematic elevational cross-sectional view illustrating the detailed configuration of the SAW filter device 1 according to this preferred embodiment.

FIG. 2 is a schematic plan view in which an electrode configuration provided on the undersurface of the filter chip 11 is seen through a piezoelectric substrate 12.

In this preferred embodiment, the piezoelectric substrate 12 is a 55° Y-cut X-propagation LiNbO$_3$ substrate. The electrodes illustrated in FIG. 2 are Al electrodes. That is, the above-described surface acoustic wave resonators P11 to P14 are made using the Al electrodes. Electrode lands 12a to 12f are connected to the surface acoustic wave resonators P11 to P14. Thus, an electrode pattern required for the circuit configuration illustrated in FIG. 1 is also provided.

Referring to FIG. 2, only the locations at which the surface acoustic wave resonators P11 to P14 are arranged are illustrated. More precisely, however, each of the surface acoustic wave resonators P11 to P14 is a one-port surface acoustic wave resonator including an IDT, which includes one pair of comb-shaped electrodes, and one pair of reflectors disposed on either side of the IDT in the propagation direction of a surface acoustic wave.

The electrode film thickness of the surface acoustic wave resonators P11 to P14 is about 3% of the wavelength of a surface acoustic wave. That is, when it is assumed that the thickness of the IDT is h and the wavelength of a surface acoustic wave is $\lambda$, the normalized film thickness $100h/\lambda$ of the IDT is about 3%. Furthermore, a duty ratio of the IDT is about 0.3.

Metal bumps 13a to 13f are provided on the electrode lands 12a to 12f, respectively. That is, the metal bumps 13a to 13f protrude downward from the undersurface of the piezoelectric substrate 12.

The mount substrate 14 illustrated in FIG. 3 is made of an appropriate insulating material such as an insulating ceramic like alumina, or a synthetic resin. Electrode lands 14a to 14e are provided on the upper surface of the mount substrate 14. The electrode land 14a is connected to an input terminal. The electrode land 14e is connected to an output terminal. The electrode land 14d is connected to the ground potential. The electrode lands 14b and 14c are connected to the inductors L11, L12, and L13 (not illustrated in FIG. 3).

Figure 5:
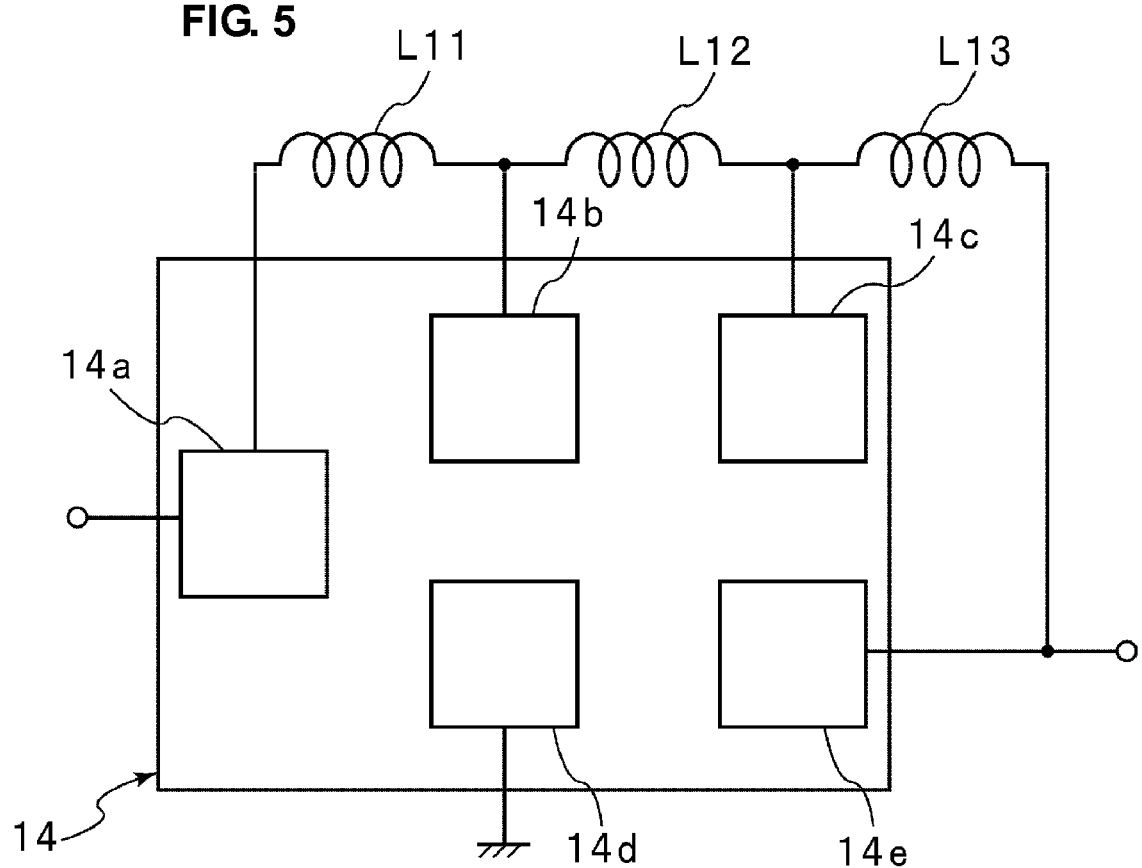
FIG. 5 is a schematic plan view illustrating a configuration according to the first preferred embodiment of the present invention in which external inductors are connected to a mount substrate.

That is, as schematically illustrated in FIG. 5, the inductors L11, L12, and L13 illustrated in FIG. 1 are defined by other inductance components different from the mount substrate 14. Chip inductance components that are mountable on the surface of the mount substrate 14 or a circuit substrate can be used for these inductance components.

On the other hand, the filter chip 11 is mounted on the mount substrate 14 using the metal bumps 13a, 13c, 13e, etc. by the flip chip bonding method as illustrated in FIG. 4, and the inductors L11 to L13 are defined by external inductance components illustrated in FIG. 5, whereby the SAW filter device 1 according to the first preferred embodiment is obtained.

The SAW filter device 1 according to this preferred embodiment has a circuit configuration similar to that of a ladder band-pass filter having a series arm resonator and a parallel arm resonator. That is, the SAW filter device 1 includes the series arm connecting the input terminal IN and the output terminal OUT and a plurality of parallel arms each connecting the series arm and the ground potential. It is preferable in a band elimination filter device, such as the SAW filter device 1, that a bandwidth in a trap band, that is, a stop bandwidth, which corresponds to a pass bandwidth of a ladder band-pass filter, be increased. By using the configuration described in Japanese Unexamined Patent Application Publication No. 9-121136, the stop bandwidth can be increased in a band elimination filter with some degree of success.

However, the inventor has found that a spurious component was generated in a stop band of a ladder pass-band filter, that is, a pass band lower than a trap band, using the configuration described in Japanese Unexamined Patent Application Publication No. 9-121136. This spurious component was generated at a frequency that was about 0.8 times the resonant frequency of a resonator. Accordingly, the spurious component was generated by a Rayleigh wave. Such a spurious component can be generated in the above-described ladder band-pass filter.

However, with a ladder band-pass filter, a frequency range in which such a spurious component is generated is a frequency range that has a large amount of attenuation and is located outside a pass band. Accordingly, the generation of a spurious component does not cause any problems.

On the other hand, in the case of the SAW filter device 1 that is a band elimination filter, such a spurious component is generated in a pass band located lower than a trap band. Accordingly, the generation of such a spurious component significantly affects an insertion loss.

Rayleigh waves are known as surface waves that are not attenuated, have a high Q, and are independent of the electrode film thickness of a piezoelectric substrate or a resonator and the duty ratio of an IDT.

However, according to this preferred embodiment, in the SAW filter device 1, the occurrence of a spurious component due to a Rayleigh wave can be reduced or eliminated. In the following, detailed descriptions will be made with reference to experimental examples.

That is, transmission characteristics were measured for four types of SAW filter devices having the same normalized electrode film thickness of about 3%, the same IDT duty ratio of about 0.3, and the same Al electrodes, but using four different types of Y-cut X-propagation $LiNbO_3$ substrates whose cutting angles $\theta$ were about 41°, about 45°, about 50°, and about 55°. The measurement results are illustrated in FIGS. 6A and 6B.

Figure 6A:
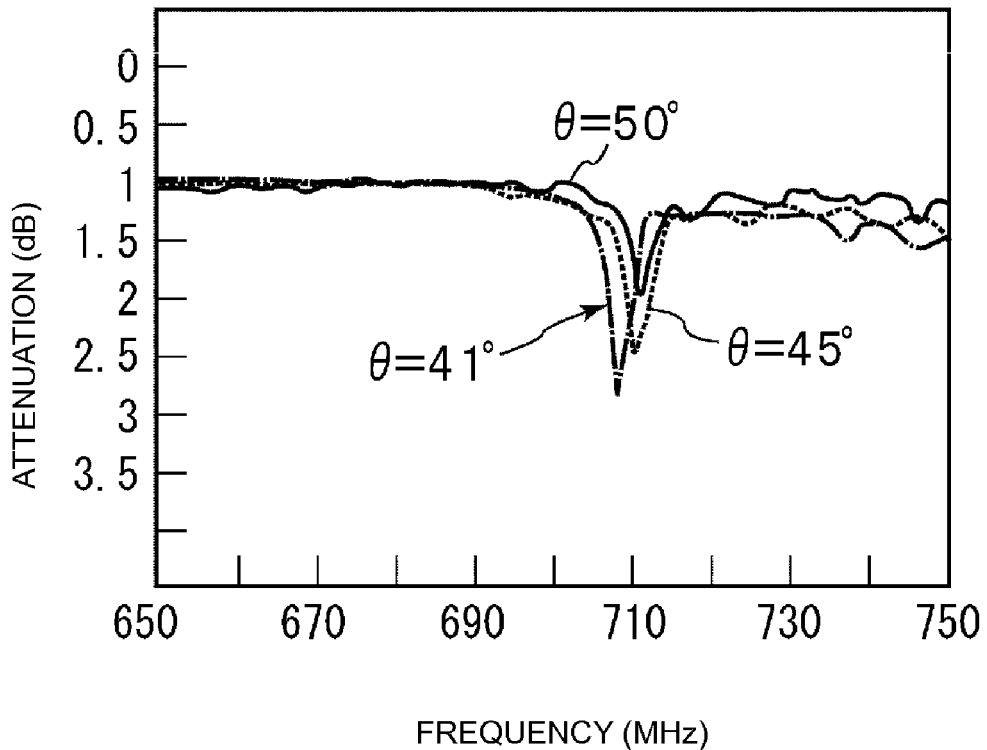
FIG. 6A is a diagram illustrating attenuation frequency characteristics in a pass band which are obtained in SAW filter devices using θ-rotated Y-cut X-propagation $LiNbO_3$ substrates whose cutting angles θ are about 41°, about 45°, and about 50°.
Figure 6B:
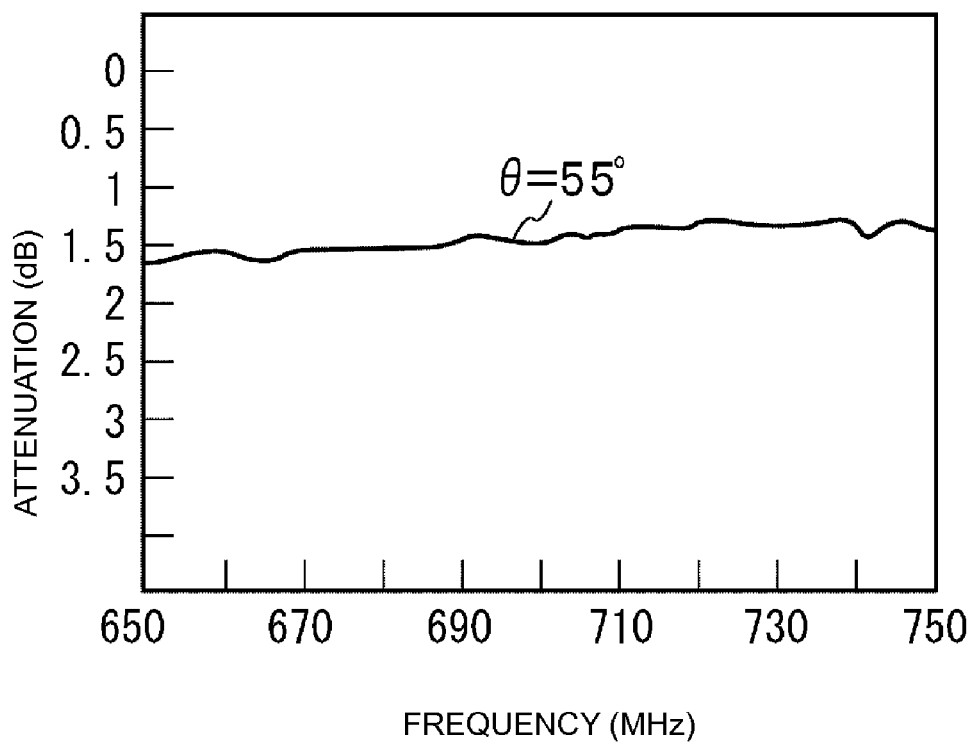
FIG. 6B is a diagram illustrating an attenuation frequency characteristic in a pass band which is obtained in a SAW filter device using a θ-rotated Y-cut X-propagation $LiNbO_3$ substrate whose cutting angle θ is about 55°.

As shown in FIGS. 6A and 6B, a spurious component of about 2.0 dB was generated when the cutting angle $\theta$ was about 41°. However, as the cutting angle $\theta$ was increased from about 41°, the spurious component level decreased. Almost no spurious component was generated when the cutting angle $\theta$ was about 55°. With a cutting angle equal to or greater than about 58°, no spurious component was generated.

In general, it is preferable that variations in the amount of attenuation in a pass band be equal to or less than about 1.0 dB. Accordingly, if the level of the spurious component is equal to or less than about 1.0 dB, that is, the cutting angle $\theta$ is equal to or greater than about 50°, the variations in the amount of attenuation in the pass band can be equal to or less than about 1.0 dB. It is therefore preferable that the Y-cut X-propagation $LiNbO_3$ substrate has a cutting angle equal to or greater than about 50°.

In this preferred embodiment, the ratio of an electrode film thickness to the wavelength of a surface wave is about 3%. However, similar effects can be obtained when the ratio is equal to or less than about 4%.

Figure 7:
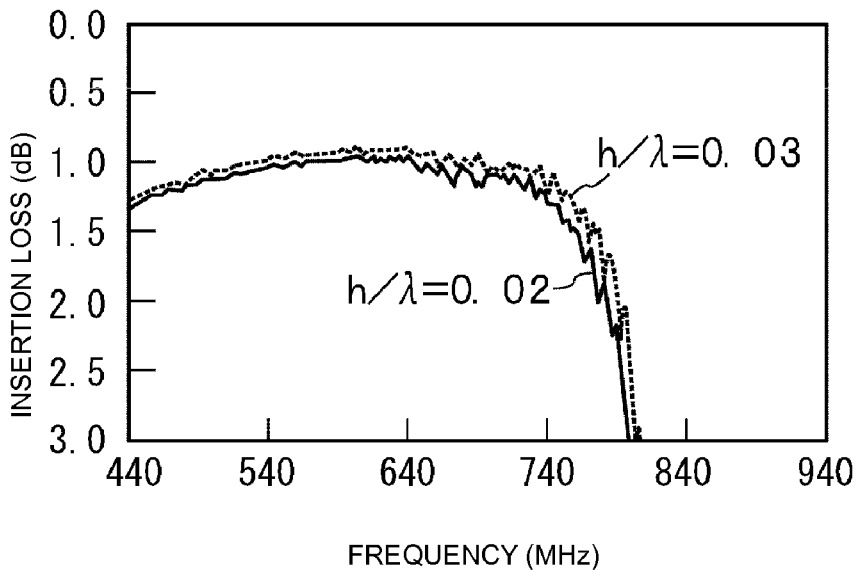
FIG. 7 is a diagram illustrating a frequency characteristic at higher frequencies of a pass band of a SAW filter device according to the first preferred embodiment of the present invention having an IDT normalized film thickness of about 3% and a frequency characteristic at higher frequencies of a pass band of a SAW filter device having an IDT normalized film thickness of about 2%.

FIG. 7 is a diagram illustrating a frequency characteristic at higher frequencies of the pass band of the above-described SAW filter device having a normalized electrode film thickness of about 3% and a frequency characteristic at higher frequencies of the pass band of a SAW filter device having the same configuration as the above-described SAW filter device except that the ratio (%) of an IDT film thickness to a wavelength is about 2% instead of about 3%.

In FIG. 7, a broken line denotes a frequency characteristic of the above-described SAW filter and a solid line denotes a frequency characteristic of the SAW filter device having the normalized IDT film thickness of about 2%. An insertion loss at higher frequencies of the pass band was slightly deteriorated with a normalized IDT film thickness of about 2%. Experiments by the inventor indicated that an insertion loss in the pass band was further deteriorated with a normalized film thickness having a value less than about 2%. Accordingly, it is preferable that the cutting angle $\theta$ is equal to or greater than about 50°, and the normalized film thickness of the above-described electrodes is in the range between about 2% and about 4%.

Figure 8:
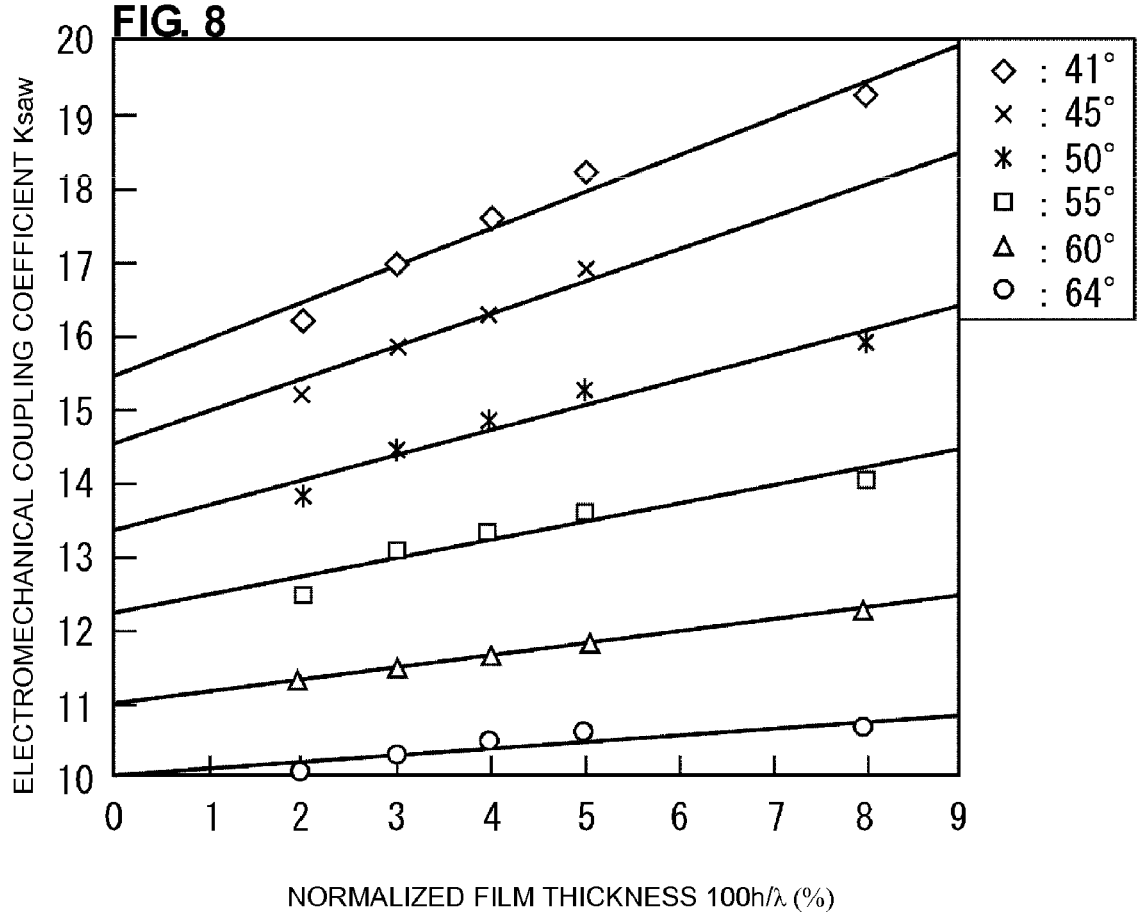
FIG. 8 is a diagram illustrating relationships between a normalized film thickness $100h/\lambda$ (%) of an IDT and an electromechanical coupling coefficient K which are obtained when a cutting angle θ of a θ-rotated Y-cut X-propagation $LiNbO_3$ substrate used in a SAW filter device according to the first preferred embodiment of the present invention is about 41°, about 45°, about 50°, about 55°, about 60°, and about 64°.

FIG. 8 is a diagram illustrating relationships between a normalized film thickness ratio (%) of an IDT having a duty ratio of about 0.3 and an electromechanical coupling coefficient which were obtained when the piezoelectric substrate cutting angles θ were about 41°, about 45°, about 50°, about 55°, about 60°, and about 64°.

As shown in FIG. 8, when the cutting angle θ is in the range between about 50° and about 55° and the normalized film thickness ratio is in the range between about 2% and about 4%, the electromechanical coupling coefficient is within the range between about 12.5% and about 15%. An electromechanical coupling coefficient K is preferably relatively large. On the other hand, however, if the electromechanical coupling coefficient K is too large, it is difficult to obtain a desired balance of the steepness of an attenuation characteristic and the amount of attenuation in the trap band. Accordingly, as described previously, by setting the electromechanical coupling coefficient such that it is within the range between about 12.5% and about 15%, the balance of the steepness of an attenuation characteristic and the amount of attenuation in the trap band is increased. That is, the cutting angle θ must be in the range between about 50° and about 55° and the normalized film thickness of the IDT must be in the range between about 2% and about 4%.

Figure 9:
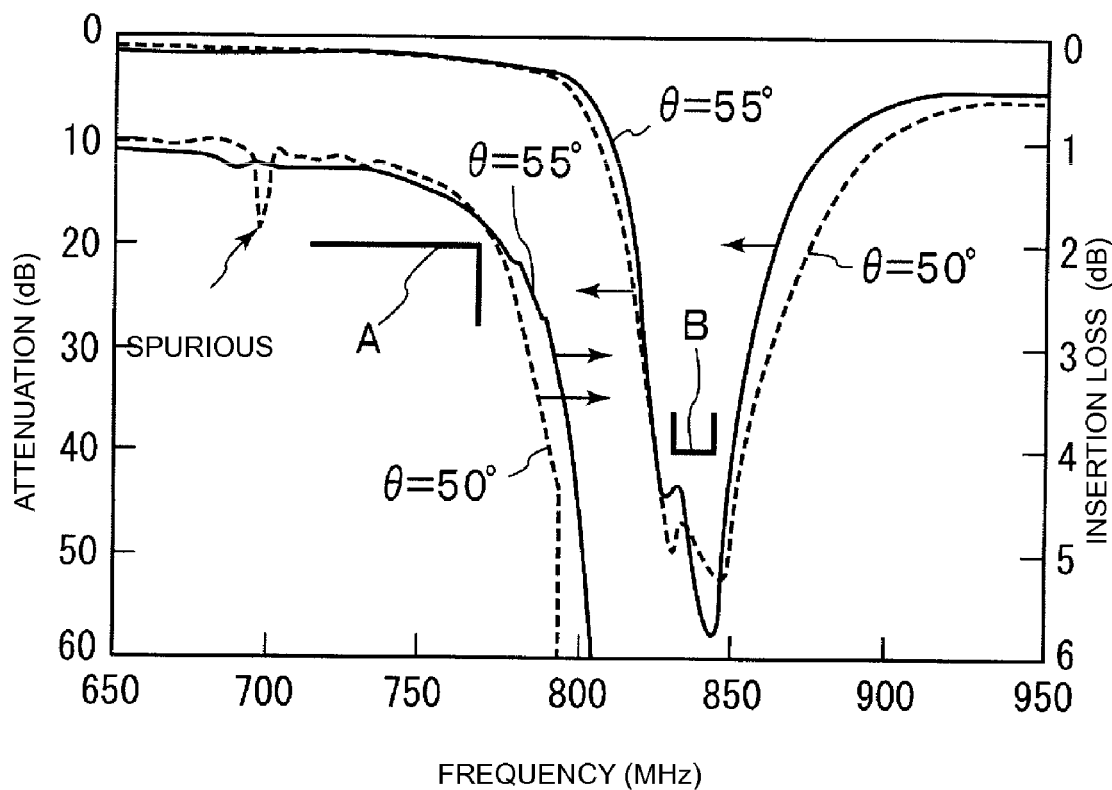
FIG. 9 is a diagram illustrating attenuation frequency characteristics obtained when a cutting angle θ of a θ-rotated Y-cut X-propagation LiNbO$_3$ substrate used in a SAW filter device according to the first preferred embodiment of the present invention is about 50° and about 55°.

Referring to FIG. 9, a solid line denotes the attenuation frequency characteristic of the SAW filter device 1 that uses the Y-cut X-propagation LiNbO$_3$ substrate whose cutting angle θ is about 55°, and a broken line denotes the attenuation frequency characteristic of a SAW filter device that uses a Y-cut X-propagation LiNbO$_3$ substrate whose cutting angle θ is about 50°.

In the SAW filter device 1 using the cutting angle θ of about 50°, the inductance values of the inductors L11, L12, and L13 were set to L11=15 nH, L12=20 nH, and L13=15 nH, respectively. The circuit constants of the surface acoustic wave resonators P11 to P14 were set as illustrated in the following Table 1.

TABLE 1

| Surface Acoustic Wave Resonator | fr [MHz] | C0 [pF] | C1 [pF] | L1 [nH] | R1 [Ω] |
| --- | --- | --- | --- | --- | --- |
| P11 | 837.12 | 2.04 | 0.31 | 0.12 | 3.3 |
| P12 | 838.95 | 2.73 | 0.43 | 0.08 | 1.8 |
| P13 | 837.24 | 2.48 | 0.39 | 0.09 | 1.7 |
| P14 | 1085.43 | 1.94 | 0.30 | 0.07 | 2.9 |

In Table 1 and the following Table 2, a symbol "fr" denotes a resonant frequency of a surface acoustic wave resonator. Each of the surface acoustic wave resonators has an equivalent circuit in which a series connection of a series inductor L1, a series capacitor C1, and a series resistor R1 is connected in parallel to a parallel capacitor C0. Referring to Table 1, a symbol "C0" denotes a parallel capacitance in the equivalent circuit of a surface acoustic wave resonator, a symbol "C1" denotes a series capacitance in the equivalent circuit, a symbol "L1" denotes a series inductance in the equivalent circuit, and a symbol "R1" denotes a series resistance in the equivalent circuit.

In the SAW filter device using the cutting angle θ of about 55°, the inductance values of the inductors L11, L12, and L13 were set to L11=13 nH, L12=18 nH, and L13=13 nH, respectively. The circuit constants of the surface acoustic wave resonators P11 to P14 were set as illustrated in the following Table 2.

TABLE 2

| Surface Acoustic Wave Resonator | fr [MHz] | C0 [pF] | C1 [pF] | L1 [nH] | R1 [Ω] |
| --- | --- | --- | --- | --- | --- |
| P11 | 834.82 | 2.64 | 0.28 | 0.13 | 1.7 |
| P12 | 839.40 | 3.41 | 0.37 | 0.10 | 1.3 |
| P13 | 841.42 | 1.89 | 0.21 | 0.17 | 2.3 |
| P14 | 1085.43 | 1.70 | 0.19 | 0.11 | 1.3 |

A normalized film thickness of an IDT was set to about 3%, and a duty ratio of the IDT was set to about 0.3. In FIG. 9, a heavy line A denotes a specification value of an insertion loss in a pass band, and a heavy line B denotes a specification value of the amount of attenuation in a trap band, that is, an attenuation band. That is, the specification value of an insertion loss is equal to or less than about 2 dB in the frequency range between about 470 MHz and about 770 MHz, and the specification value of the amount of attenuation in the trap band, which is represented by the heavy line B, is equal to or greater than about 40 dB in the frequency range between about 830 MHz and about 845 MHz.

As shown in FIG. 9, when the cutting angle θ is about 50°, a stop bandwidth in which the amount of attenuation is equal to or greater than about 40 dB is about 28 MHz. On the other hand, when the cutting angle θ is about 55°, a stop bandwidth in which the amount of attenuation is equal to or greater than about 40 dB is about 25 MHz. The low frequency end of the 40 dB stop bandwidth was set to the same frequency of about 825 MHz in the both cases of the cutting angle θ of about 50° and about 55°. The low frequency end of the 40 dB stop bandwidth includes a frequency margin of about 5 MHz.

A difference between a frequency in the high frequency end portion of the pass band at which the insertion loss is about 2 dB and an upper limit frequency of about 770 MHz in the pass band is about 5 MHz when the cutting angle θ is about 50°, and is about 8 MHz when the cutting angle θ is about 55°. Accordingly, a frequency margin is sufficiently large in the both cases. However, it can be understood that the frequency margin obtained in the case of the cutting angle θ of about 55° is greater than that obtained in the case of the cutting angle θ of about 50°.

If the cutting angle θ is less than about 50°, the specification value of the insertion loss cannot be satisfied, because a spurious component is generated under the occurrence of a Rayleigh wave in the vicinity of about 700 MHz. A deviation of the insertion loss in the pass band must be equal to or less than about 1 dB in order to meet specifications. If the cutting angle θ exceeds about 55°, the stop bandwidth in which the amount of attenuation is equal to or greater than about 40 dB becomes less than about 25 MHz and the frequency margin for the stop bandwidth therefore is reduced. Accordingly, the cutting angle θ must be in the range between about 50° and about 55°.

Figure 10:
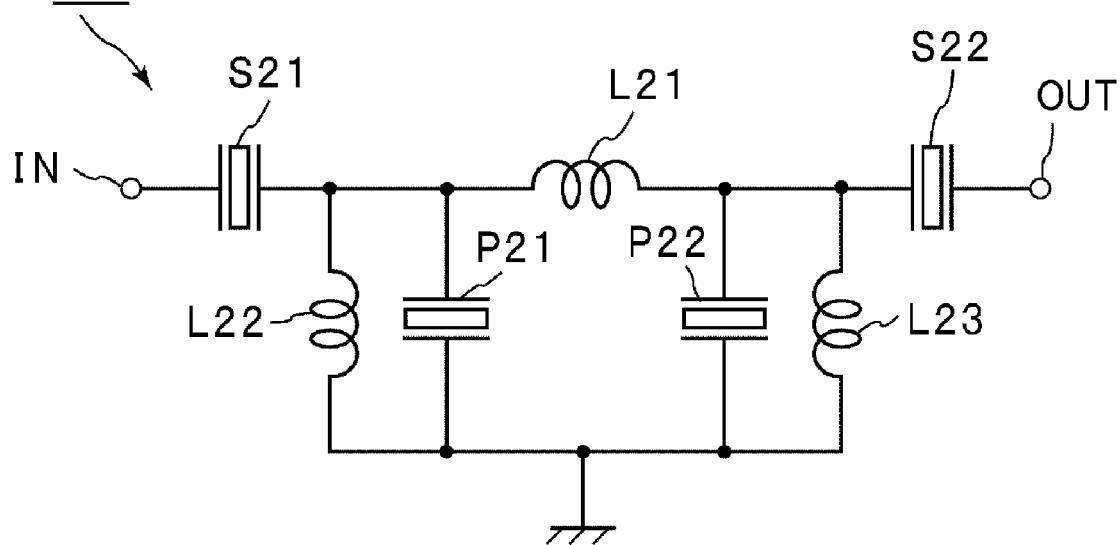
FIG. 10 is a circuit diagram illustrating a circuit configuration of a SAW filter device according to a second preferred embodiment of the present invention.

FIG. 10 is a circuit diagram illustrating a circuit configuration of a SAW filter device according to a second preferred embodiment of the present invention.

A circuit configuration of a SAW filter device according to the present invention is not limited to a circuit configuration according to the first preferred embodiment. In a SAW filter device 21 according to the second preferred embodiment, a first inductor L21 is connected to a series arm connecting the input terminal IN and the output terminal OUT. Both ends of the first inductor L21 are individually connected to the ground potential via parallel arms. One of the parallel arms is connected to a first surface acoustic wave resonator P21 and the other one of the parallel arms is connected to a first surface acoustic wave resonator P22. A trap circuit portion is provided using the first inductor L21 and the first surface acoustic wave resonators P21 and P22.

In this preferred embodiment, filter circuit portions are individually provided between the above-described trap circuit portion and the input terminal IN and between the above-described trap circuit portion and the output terminal OUT.

One of the filter circuit portions includes a second surface acoustic wave resonator S21 that is a series arm resonator connected in series between the input terminal IN and the first inductor L21, and a second inductor L22 connected between the ground potential and one end of the second surface acoustic wave resonator S21 which is opposite to the other end connected to the input terminal IN. The other one of the filter circuit portions is provided between the trap circuit portion and the output terminal OUT. That is, the other one of the filter circuit portions includes a second surface acoustic wave resonator S22 that is a series arm resonator connected in series between the first inductor L21 and the output terminal OUT, and a second inductor L23 connected between the ground potential and one end of the second surface acoustic wave resonator S22 which is on the side of the trap circuit portion.

Here, the resonant frequency of the second surface acoustic wave resonators S21 and S22 is substantially the same as the high frequency end of the pass band of the SAW filter device 21.

Accordingly, a signal can be transmitted in the pass band, and a frequency band lower than the pass band and the trap band can be attenuated.

Similar to the first preferred embodiment, in this preferred embodiment, a θ-rotated Y-cut X-propagation LiNbO$_3$ substrate is used as a piezoelectric substrate, one-port SAW resonators each including an IDT made of Al or an Al alloy are provided as the second surface acoustic wave resonators S21 and S22 and the first surface acoustic wave resonators P21 and P22, a cutting angle θ is set so that it is within the range between about 50° and about 55°, a normalized film thickness (h/λ)×100(%) of the thickness h of the IDT is set within the range between about 2% and about 4%, and a duty ratio is set to a value equal to or less than about 0.4. Consequently, a spurious component can be more effectively prevented from being generated due to a Rayleigh wave.

Furthermore, in this preferred embodiment, the above-described filter circuit portions are connected to the trap circuit portion. Accordingly, a pass band with a wide stop band is achieved. That is, using the parallel resonance provided by the second surface acoustic wave resonators S21 and S22 which are the series arm resonators and the series resonance performed by the first surface acoustic wave resonators P21 and P22 which are parallel arm resonators, an attenuation characteristic can be obtained in a frequency band higher than the pass band. Unlike the first preferred embodiment, in a VHF frequency band, that is, a frequency band lower than the pass band, a large amount of attenuation can also be obtained.

Figure 11A:
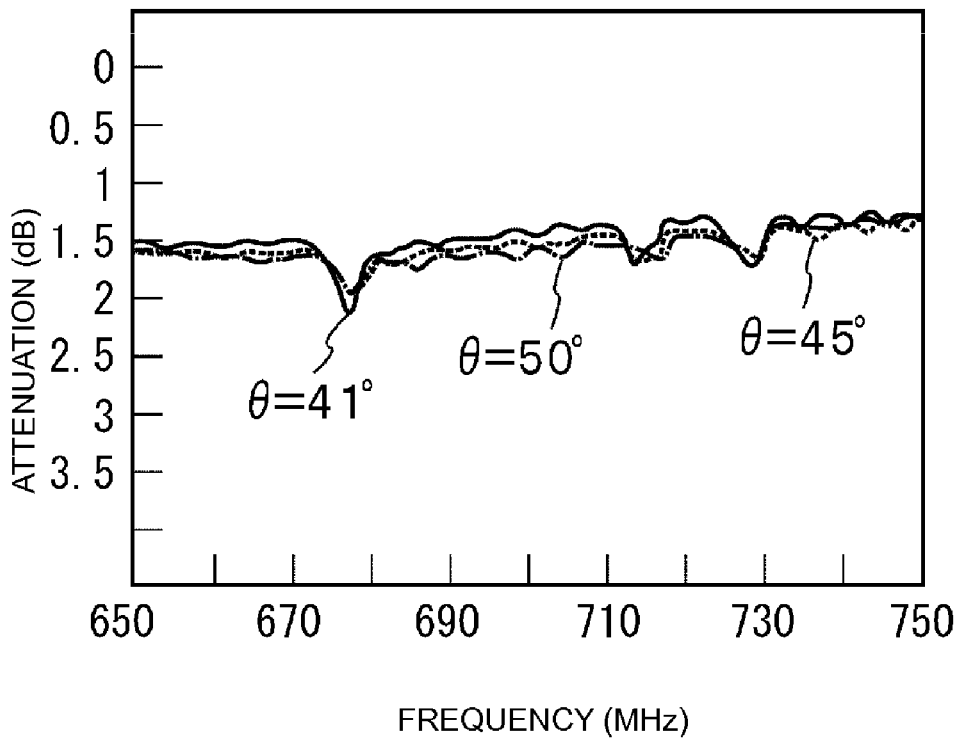
FIG. 11A illustrates attenuation frequency characteristics obtained when a cutting angle θ of a θ-rotated Y-cut X-propagation LiNbO$_3$ substrate used in a SAW filter device according to the second preferred embodiment of the present invention is about 41°, about 45°, and about 50°.
Figure 11B:
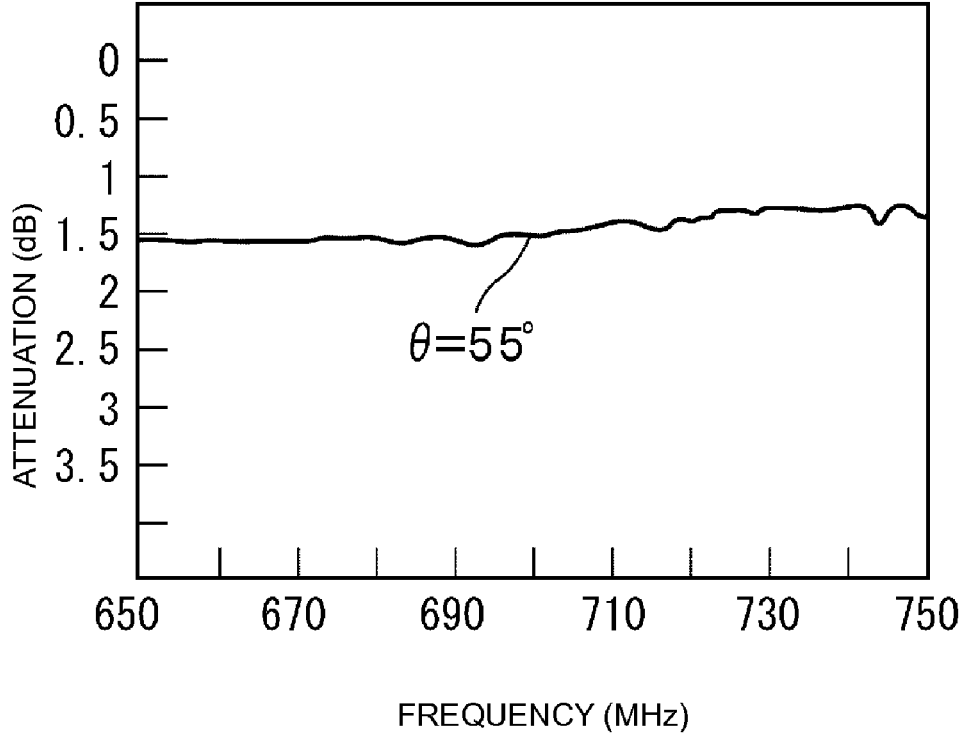
FIG. 11B illustrates an attenuation frequency characteristic obtained when a cutting angle θ of a θ-rotated Y-cut X-propagation LiNbO$_3$ substrate used in a SAW filter device according to the second preferred embodiment of the present invention is about 55°.

The fact that the occurrence of a spurious component can be reduced when the cutting angle θ, the normalized film thickness of the IDT, and the duty ratio are set as described previously will be described in this preferred embodiment with reference on a detailed experimental example. FIG. 11A illustrates the transmission characteristics of the SAW filter device 21 when the cutting angle θ is about 41°, about 45°, and about 50°, that is, the transmission characteristics in the frequency range between about 650 MHz to about 750 MHz. FIG. 11B illustrates a transmission characteristic of the SAW filter device 21 when the cutting angle θ is about 55°. As shown in FIGS. 11A and 11B, as the cutting angle θ increases, the level of the spurious component in the vicinity of about 675 MHz decreases. It can be understood that almost no spurious component was generated with the cutting angle θ of about 55°.

Figure 12:
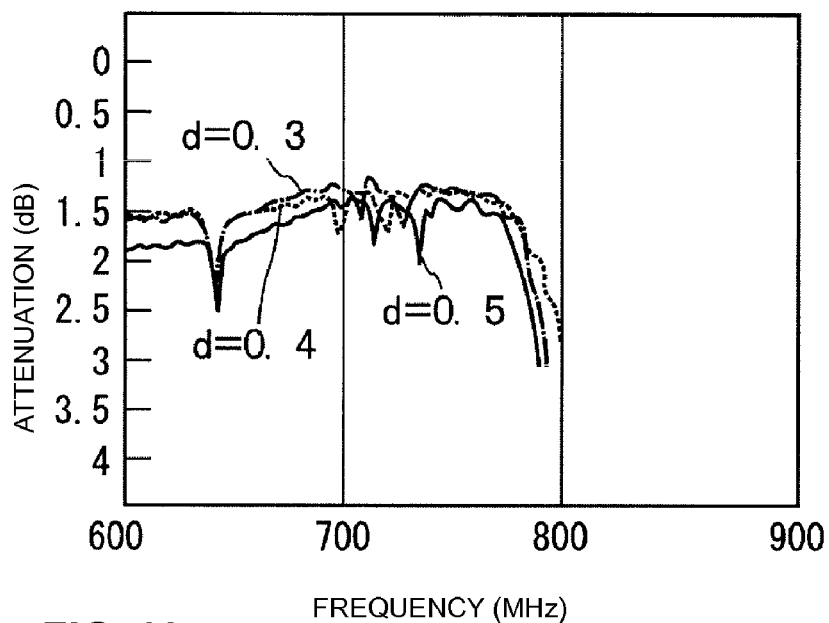
FIG. 12 is a diagram illustrating frequency characteristics at higher frequencies of a pass band which are obtained when a duty ratio of an IDT included in a SAW filter device according to the second preferred embodiment of the present invention is about 0.3, about 0.4, and about 0.5.

FIG. 12 illustrates attenuation frequency characteristics of the SAW filter device 21 according to the second preferred embodiment which has an IDT duty ratio of about 0.3, a SAW filter device having substantially the same configuration as that of the SAW filter device 21 except that the duty ratio is about 0.4, and a SAW filter device that is prepared for comparison and has substantially the same configuration as that of the SAW filter device 21 except that the duty ratio is about 0.5. Here, the attenuation frequency characteristics at higher frequencies in the pass band are illustrated.

As shown in FIG. 12, when the duty ratio is about 0.5, the level of a spurious component was increased in the vicinity of about 675 MHz. Furthermore, in the vicinity of the high frequency end portion of the pass band, that is, in the range between about 700 MHz and about 760 MHz, the number of spurious components was increased. Accordingly, it is preferable that the duty ratio be less than about 0.5. The inventor found that, similar to the first preferred embodiment, the occurrence of a spurious component could be reduced at higher frequencies in the pass band when the duty ratio is equal to or less than about 0.4 and a desired filter characteristic could therefore be obtained.

In the second preferred embodiment, the filter circuit portion including the second surface acoustic wave resonator S21 and the second inductor L22 is provided at a stage prior to the trap circuit portion, and the filter circuit portion including the second surface acoustic wave resonator S22 and the second inductor L23 is provided at a stage subsequent to the trap circuit portion. However, only one of the filter circuit portions may be provided.

Figure 13:
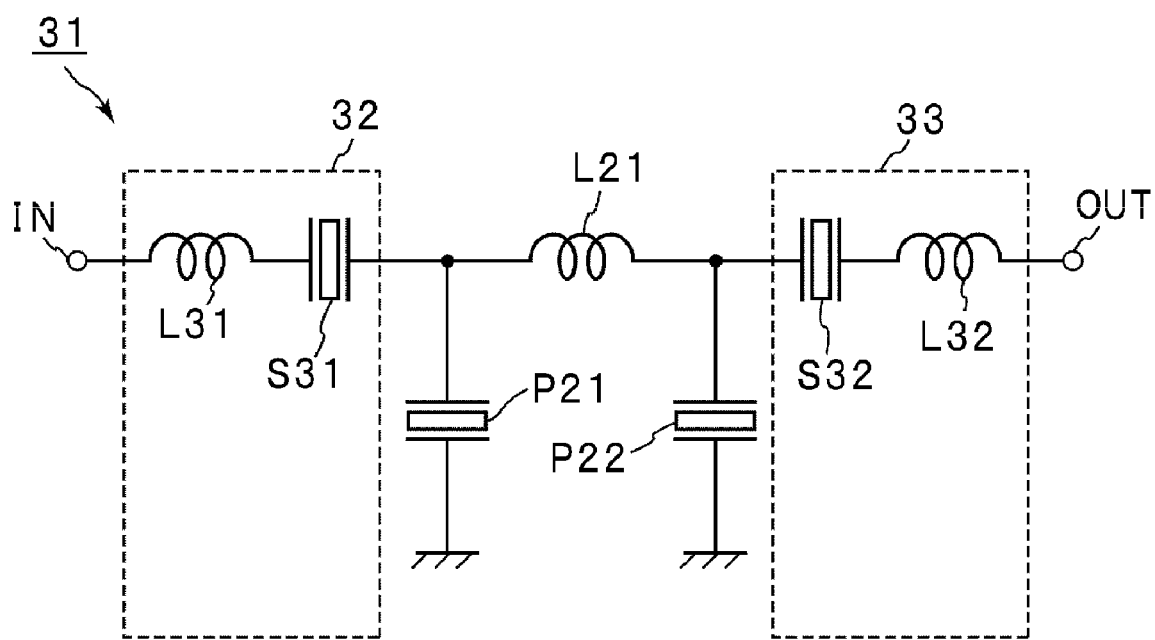
FIG. 13 is a circuit diagram of a SAW filter device according to a third preferred embodiment of the present invention.

FIG. 13 is a circuit diagram of a SAW filter device according to a third preferred embodiment of the present invention. In a SAW filter device 31 according to the third preferred embodiment, a trap circuit portion and filter circuit portions are connected in series to a series arm connecting the input terminal IN and the output terminal OUT. In this preferred embodiment, a filter circuit portion 32 is provided at a stage prior to the trap circuit portion, and a filter circuit portion 33 is provided at a stage subsequent to the trap circuit portion. The filter circuit portion 32 is connected to the series arm connecting the input terminal IN and the output terminal OUT, and includes a third inductor L31 and a first surface acoustic wave resonator S31 that is a series arm resonator. The third inductor L31 and the first surface acoustic wave resonator S31 are connected in series with each other. The filter circuit portion 33 is also connected to the series arm connecting the input terminal IN and the output terminal OUT, and includes a third inductor L32 and a first surface acoustic wave resonator S32 that is a series arm resonator. The third inductor L32 and the first surface acoustic wave resonator S32 are connected in series with each other.

Only one of the filter circuit portions 32 and 33 may be provided.

The trap circuit portion has substantially the same configuration as that of the trap circuit portion described in the second preferred embodiment. That is, the trap circuit portion includes the first inductor L21 connected to the series arm, a second surface acoustic wave resonator P21 that is a parallel arm resonator connected to a parallel arm connecting one end of the first inductor L21 and the ground potential, and a third surface acoustic wave resonator P22 that is a parallel arm resonator connected to a parallel arm connecting the other end of the first inductor L21 to the ground potential.

In the SAW filter device 31, the pass band has a first center frequency. A second center frequency is higher than the first center frequency. The second center frequency is included in a filter frequency characteristic in the trap band. The filter frequency characteristic in the trap band includes the capacitance components of the second surface acoustic wave resonator P21 and the third surface acoustic wave resonator P22, the capacitance components of the first surface acoustic wave resonators S31 and S32, and the inductance components of the first inductor L21 and the third inductors L31 and L32.

Similar to the first and second preferred embodiments, in this preferred embodiment, a LiNbO$_3$ substrate using the above-described specific cutting angle θ is used as a piezoelectric substrate, one-port SAW resonators each including an IDT made of Al or an Al alloy are used as the surface acoustic wave resonators P21, P22, S31, and S32, and a normalized film thickness of the IDT and a duty ratio of the IDT are set so that they are within the above-described specific ranges. Consequently, a spurious component can be more effectively prevented from being generated due to a Rayleigh wave.

In this preferred embodiment, the filter circuit portions 32 and 33 are connected to the trap circuit portion. Accordingly, a signal can be transmitted in the pass band, and a signal can be attenuated in a VHF band lower than the pass band, the trap band, and a frequency band higher than the trap band.

Figure 14:
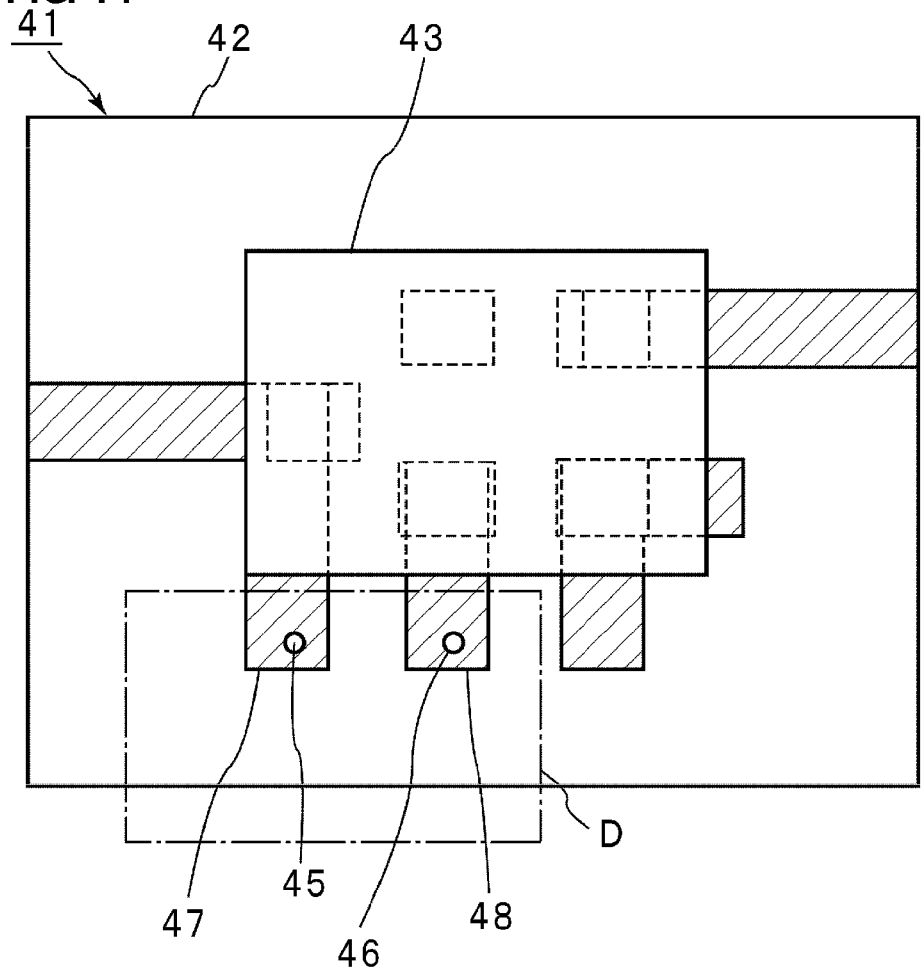
FIG. 14 is a schematic plan view illustrating a configuration of a SAW filter device according to a modification of the present invention.
Figure 15A:
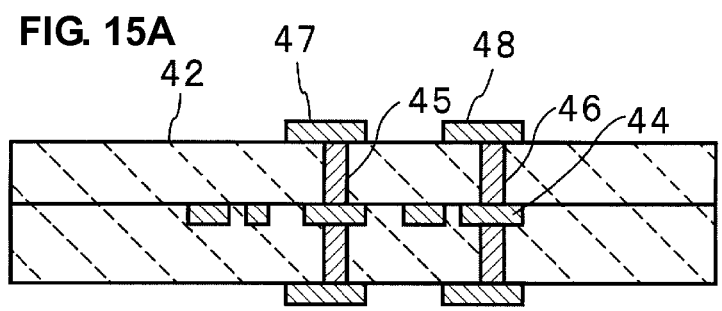
FIG. 15A is a schematic partly-broken elevational cross-sectional view used to make a description about an inductor embedded in a circuit substrate in the SAW filter device illustrated in FIG. 14.
Figure 15B:
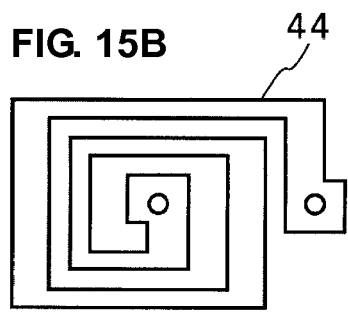
FIG. 15B is a schematic plan view of a coiled conductor pattern that is embedded in the SAW filter device as an inductor.

In the first preferred embodiment, as schematically illustrated in FIG. 5, the inductors L11, L12, and L13 are defined by external inductance components. However, as illustrated in FIGS. 14 and 15, these inductors may be embedded in a circuit substrate. That is, FIG. 14 is a schematic plan view of a SAW filter device according to a modification of the present invention. A SAW filter device 41 according to a modification of the present invention includes a mount substrate 43 on which a filter chip is disposed and a circuit substrate 42 that is a package material on which the mount substrate 43 is disposed. On a portion of the circuit substrate 42, that is, in an area surrounded by an alternate long and short dash line D in FIG. 14, inductors are embedded. FIG. 15A is a partial enlarged cross-sectional view of the area surrounded by the alternate long and short dash line D. FIG. 15B is a schematic plan view of the area surrounded by the alternate long and short dash line D.

FIG. 15A is a schematic elevational cross-sectional view in which the circuit substrate 42 is partially enlarged. Here, in the circuit substrate 42, a coiled conductor pattern 44 is formed as an inductor. The plan view pattern of the coiled conductor pattern 44 is illustrated in FIG. 15B.

The coiled conductor pattern 44 has a coiled planar shape. The coiled conductor pattern 44 extends out from the upper surface of the circuit substrate 42 using via hole electrodes 45 and 46. The top ends of the via hole electrodes 45 and 46 are connected to electrode lands 47 and 48, respectively. The electrode lands 47 and 48 are connected to bumps (not illustrated) protruding through the lower surface of the mount substrate 43 on which the filter chip is formed.

Thus, according to preferred embodiments of the present invention, inductors required for a SAW filter device are defined by external inductance components, such as chip inductance components. However, such inductors may be defined by embedding a conductor pattern in the mount substrate 43 that is a package material, or in the circuit substrate 42 on which the mount substrate 43 is placed. In this case, the number of external inductance components can be reduced or eliminated. Accordingly, the size and thickness of a SAW filter device can be reduced. Furthermore, variations in characteristic minimized when an inductance component is used.

In the above-described preferred embodiments and the above-described modification, the IDT is preferably made of Al. However, the IDT may be made of an Al alloy.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A SAW filter device having a trap band and a pass band lower than the trap band, comprising:
   a filter chip including a θ-rotated Y-cut X-propagation LiNbO$_3$ substrate and a plurality of one-port SAW resonators provided on the θ-rotated Y-cut X-propagation LiNbO$_3$ substrate, the plurality of one-port SAW resonators each including an IDT made of one of Al and an Al alloy; wherein
   a cutting angle θ of the θ-rotated Y-cut X-propagation LiNbO$_3$ is in a range between about 50° and about 55°, a normalized film thickness of the IDT 100h/λ, expressed in %, wherein h denotes a thickness of the IDT and λ denotes a wavelength of a surface acoustic wave, is in a range between about 2% and about 4%, and a duty ratio of the IDT is less than 0.4.

2. The SAW filter device according to claim 1, further comprising:
   a plurality of first inductors provided in a series arm connecting an input terminal and an output terminal; wherein
   one of the plurality of one-port SAW resonators is connected between the input terminal and a ground potential, another one of the plurality of one-port SAW resonators is connected between the output terminal and the ground potential, and the others of the plurality of one-port SAW resonators are each connected between the ground potential and a node between two of the plurality of first inductors.

3. The SAW filter device according to claim 2, further comprising:
   a mount substrate on which the filter chip is provided; wherein
   the mount substrate includes a single ground terminal, and all portions to be connected to the ground potential which are included in the filter chip are electrically connected to the ground terminal; and
   the one of the plurality of one-port SAW resonators connected between either the input terminal or the output terminal and the ground potential defines a capacitive element in the trap band and the pass band, and has a resonant frequency higher than an antiresonant frequency of the others of the plurality of one-port SAW resonators.

4. The SAW filter device according to claim 3, further comprising:
   a circuit substrate underlying the mount substrate on which the filter chip including the LiNbO$_3$ substrate is provided; wherein
   the plurality of first inductors are embedded in the mount substrate.

5. The SAW filter device according to claim 3, further comprising:
   a circuit substrate underlying the mount substrate on which the filter chip including the LiNbO$_3$ substrate is provided; wherein
   the plurality of first inductors are embedded in the circuit substrate.

6. The SAW filter device according to claim 2, wherein the plurality of first inductors are chip inductance components.

7. The SAW filter device according to claim 1, further comprising:
- a trap circuit portion including a first inductor provided in a series arm connecting an input terminal and an output terminal, and two first resonators, one of which is connected between one end of the first inductor and a ground potential and the other one of which is connected between the other end of the first inductor and the ground potential; and
- a filter circuit portion provided between the trap circuit portion and at least one of the input terminal and the output terminal; wherein
- the filter circuit portion includes a second resonator connected between the trap circuit portion and either the input terminal or the output terminal included in the series arm, and a second inductor connected between one end of the second resonator and the ground potential;
- a resonant frequency of the second resonator is substantially the same as a high frequency end of the pass band; and
- the first resonators and the second resonator are included in the plurality of one-port SAW resonators.

8. The SAW filter device according to claim 1, further comprising:
- a filter circuit portion including a third inductor provided in a series arm connecting an input terminal and an output terminal and a first resonator connected in series to the third inductor; and
- a trap circuit portion including at least one first inductor provided in the series arm, a second resonator connected between one end of the first inductor and a ground potential, and a third resonator connected between the other end of the first inductor and the ground potential; wherein
- the filter circuit portion and the trap circuit portion are connected in series in the series arm;
- the pass band has a first center frequency, and a second center frequency is higher than the first center frequency, the second center frequency being included in a filter frequency characteristic defined by capacitance components of the first, second, and third resonators and inductance components of the first and third inductors; and
- the first, second, and third resonators are included in the plurality of one-port SAW resonators.

* * * * *